(12) United States Patent
He et al.

(10) Patent No.: US 11,227,948 B2
(45) Date of Patent: Jan. 18, 2022

(54) LATERAL DOUBLE-DIFFUSED METAL OXIDE SEMICONDUCTOR COMPONENT AND MANUFACTURING METHOD THEREFOR

(71) Applicant: CSMC TECHNOLOGY FAB2 CO., LTD., Jiangsu (CN)

(72) Inventors: Nailong He, Wuxi New District (CN); Sen Zhang, Wuxi New District (CN); Xuchao Li, Wuxi New District (CN)

(73) Assignee: CSMC TECHNOLOGIES FAB2 CO., LTD., Wuxi New District (CN)

( * ) Notice: Subject to any disclaimer, the term of this patent is extended or adjusted under 35 U.S.C. 154(b) by 64 days.

(21) Appl. No.: 16/645,139

(22) PCT Filed: Sep. 1, 2018

(86) PCT No.: PCT/CN2018/900005
§ 371 (c)(1),
(2) Date: Mar. 6, 2020

(87) PCT Pub. No.: WO2019/047988
PCT Pub. Date: Mar. 14, 2019

(65) Prior Publication Data
US 2021/0036150 A1    Feb. 4, 2021

(30) Foreign Application Priority Data
Sep. 7, 2017    (CN) .......................... 201710801871.7

(51) Int. Cl.
*H01L 21/00*    (2006.01)
*H01L 29/78*    (2006.01)
(Continued)

(52) U.S. Cl.
CPC .... *H01L 29/7824* (2013.01); *H01L 21/76237* (2013.01); *H01L 21/76243* (2013.01); *H01L 29/0634* (2013.01); *H01L 29/66681* (2013.01)

(58) Field of Classification Search
CPC .......... H01L 29/7824; H01L 21/76237; H01L 21/76243; H01L 29/0634; H01L 29/66681
See application file for complete search history.

(56) References Cited

U.S. PATENT DOCUMENTS 6,821,824 B2    11/2004  Minato et al.
2009/0065863 A1*  3/2009  Park ................... H01L 29/7816
257/343
(Continued)

FOREIGN PATENT DOCUMENTS

CN    101388408 A    3/2009
CN    101937927 A    1/2011
(Continued)

OTHER PUBLICATIONS

International Search Report dated Nov. 21, 2018 in the parent application PCT/CN2018/900005 (2 pages).
(Continued)

*Primary Examiner* — Richard A Booth
(74) *Attorney, Agent, or Firm* — Polsinelli PC

(57) ABSTRACT

A lateral double-diffused metal oxide semiconductor component and a manufacturing method therefor. The lateral double-diffused metal oxide semiconductor component comprises: a semiconductor substrate, the semiconductor substrate being provided thereon with a drift area; the drift area being provided therein with a trap area and a drain area, the trap area being provided therein with an active area and a channel; the drift area being provided therein with a deep trench isolation structure arranged between the trap area and the drain area, and the deep trench isolation structure being
(Continued)

provided at the bottom thereof with alternately arranged first p-type injection areas and first n-type injection areas.

15 Claims, 13 Drawing Sheets

(51) Int. Cl.
    *H01L 21/762*      (2006.01)
    *H01L 29/06*      (2006.01)
    *H01L 29/66*      (2006.01)

(56) References Cited

U.S. PATENT DOCUMENTS

2016/0064487 A1\* 3/2016 Park .................... H01L 29/1095
                                                                            257/343
2016/0322459 A1    11/2016 Yilmaz et al.

FOREIGN PATENT DOCUMENTS

| CN | 104517853 A | 4/2015 |
|---|---|---|
| CN | 106033775 A | 10/2016 |
| KR | 10-2011-0078621 A | 7/2011 |
| KR | 10-2014-0124950 A | 10/2014 |
| WO | 2017/048541 A1 | 3/2017 |

OTHER PUBLICATIONS

Chinese Office Action dated Jun. 3, 2020 issued in corresponding Patent Application No. 201710801871.7 (8 pages).
Korean Office Action dated Apr. 23, 2021 issued in corresponding Patent Application No. 10-2020-7009898 (5 pages).

\* cited by examiner

```
┌─────────────────────────────────────────────────────────────┐
│   Providing a semiconductor substrate, a drift region is formed on the   │─── 701
│ semiconductor substrate, a well region and a drain region are formed in  │
│    the drift region, a source region and a channel are formed in the well│
│ region; and a first deep trench and a third deep trench located between the│
│        well region and the drain region are formed in the drift region.  │
└─────────────────────────────────────────────────────────────┘
                                    │
                                    ▼
┌─────────────────────────────────────────────────────────────┐
│   Performing ion implantation to the first deep trench and the third deep│─── 702
│   trench to form first N-type injection region at a bottom of the first deep│
│   trench and third N-type injection region at a bottom and a sidewall of the│
│                              third deep trench.                          │
└─────────────────────────────────────────────────────────────┘
                                    │
                                    ▼
┌─────────────────────────────────────────────────────────────┐
│   Filling the first deep trench and the third deep trench to form a first deep│─── 703
│                          trench isolation structure.                     │
└─────────────────────────────────────────────────────────────┘
                                    │
                                    ▼
┌─────────────────────────────────────────────────────────────┐
│              Forming a second deep trench and a fourth deep trench.      │─── 704
└─────────────────────────────────────────────────────────────┘
                                    │
                                    ▼
┌─────────────────────────────────────────────────────────────┐
│   Performing ion implantation to the second deep trench and the fourth   │─── 705
│   deep trench to form first P-type injection region at a bottom of the second│
│   deep trench and third P-type injection region at a bottom and a sidewall│
│                          of the fourth deep trench.                      │
└─────────────────────────────────────────────────────────────┘
                                    │
                                    ▼
┌─────────────────────────────────────────────────────────────┐
│       Filling the second deep trench and the fourth deep trench to form a│─── 706
│                       second deep trench isolation structure.            │
└─────────────────────────────────────────────────────────────┘
```

Fig. 7

LATERAL DOUBLE-DIFFUSED METAL OXIDE SEMICONDUCTOR COMPONENT AND MANUFACTURING METHOD THEREFOR

CROSS REFERENCE TO RELATED APPLICATIONS

This application is a National Phase of International Application No. PCT/CN2018/900005, filed on Sep. 1, 2018, which claims priority to Chinese Patent Application No. 201710801871.7, filed on Sep. 7, 2017, the contents of which are expressly incorporated by reference herein in their entireties.

TECHNICAL FIELD

The present disclosure relates to the technical field of semiconductor, in particular to a lateral double-diffused metal-oxide semiconductor device and a method for manufacturing the same.

BACKGROUND

In the development of high-voltage MOS, there are two main types: vertical double-diffused metal-oxide semiconductor (VDMOS) and lateral double-diffused metal-oxide semiconductor (LDMOS). Although VDMOS has small on-resistance and small layout, it is not easy to be compatible with low-voltage CMOS circuits because of its longitudinal structure. However, LDMOS has better thermal stability and frequency stability, higher gain and durability, lower feedback capacitance and thermal resistance, constant input impedance and simpler bias circuit. Therefore, it has been widely used at present.

In the current high-voltage LDMOS devices, the conventional structure Single Resurf (SR, Resurf is reduce surface field technology), Double Resurf (DR), triple Resurf (TR) and multi Resurf LDMOS devices have been widely used. In order to obtain lower on-resistance based on the same voltage resistance, super-junction (SJ) technology is required. However, so far SJ technology has only been maturely used in vertical discrete transistors, such as VDMOS or IGBT. When SJ technology is used in laterally transistors (e.g. LDMOS), there are many problems, firstly the reliability for example, secondly the realization of the process.

SUMMARY

Based on above, it is necessary to provide a lateral double-diffused metal-oxide semiconductor device and manufacturing method therefor.

A semi lateral double-diffused metal-oxide semiconductor device includes:

a semiconductor substrate;

a drift region disposed on the semiconductor substrate, wherein the drift region comprises a well region and a drain region, and the well region comprises a source region and a channel; and a deep trench isolation structure disposed between the well region and the drain region of the drift region, wherein a first P-type implantation region and a first N-type implantation region are alternately arranged at a bottom of the deep trench isolation structure, the first P-type implantation region and the first N-type implantation region extend along a direction from the well region to the drain region.

Details of one or more embodiments of the present application are set forth in the following drawings and descriptions. Other features, purposes and advantages of the present application will become apparent from the description, drawings and claims.

In other aspect, the present disclosure also provides a method for manufacturing a lateral double-diffused metal-oxide semiconductor device, which includes:

providing a semiconductor substrate;

forming a drift region on the semiconductor substrate;

forming a well region and a drain region in the drift region, forming a source region and a channel in the well region; and forming a deep trench isolation structure located between the well region and the drain region in the drift region, and forming a first P-type implantation region and a first N-type implantation region that are alternately arranged at a bottom of the deep trench isolation structure, wherein the first P-type implantation region and the first N-type implantation region extend in a direction from the well region to the drain region.

BRIEF DESCRIPTION OF THE DRAWINGS

In order to more clearly explain the technical solution in the embodiment of the application, the following will briefly introduce the drawings needed in the description of the embodiment. Obviously, the drawings in the description below are only some embodiments of the application. For those skilled in the art, drawings of other embodiments can be obtained according to these drawings without any creative efforts.

In the drawings:

FIG. 7 is a flow chart for a manufacturing method for lateral double-diffused metal-oxide semiconductor device according to another embodiment of the present disclosure;

DETAILED DESCRIPTION

Figure 1A:
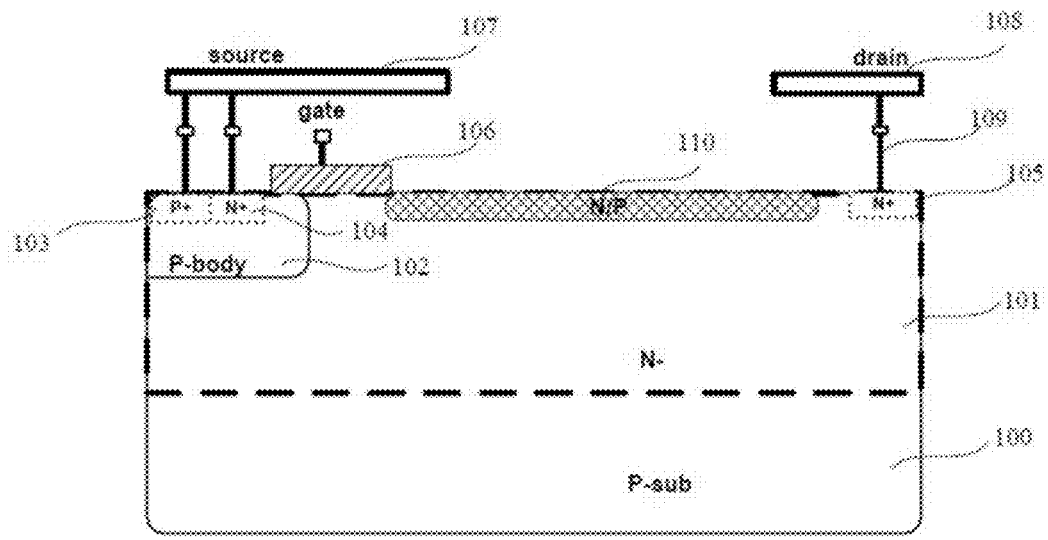
FIG. 1A is a schematic sectional view of a lateral double-diffused metal-oxide semiconductor device formed with a super-junction in the prior art.

In the following description, a large number of specific details are given to provide a more thorough understanding of the invention. However, it will be apparent to those skilled in the art that the invention can be implemented without one or more of these details. In other examples, in order to avoid confusion with this present invention, some technical features known in the art are not described.

It should be understood that the present invention can be implemented in different forms and should not be interpreted as limited to the embodiments proposed herein. On the contrary, providing these embodiments will make the disclosure thorough and complete, and completely transfer the scope of the invention to those skilled in the art. In the drawings, for clarity, the dimensions of layers and regions, as well as the relative dimensions, may be exaggerated. The same reference numerals throughout represent the same elements.

It should be understood that when elements or layers are called "on", "adjacent to", "connected to" or "coupled to" other elements or layers, they can be directly on, adjacent to, connected to or coupled to other elements or layers, or there can be intermediate elements or layers. Instead, when an element is called "directly on", "directly adjacent with", "directly connected", or "directly coupled to" other elements or layers, there is no intermediate element or layer. It should be understood that although the terms first, second, third, etc. may be used to describe various elements, components, regions, layers and/or parts, these elements, components, regions, layers and/or parts should not be limited by these terms. These terms are only used to distinguish one element, component, region, layer or part from another. Therefore, without departing from the teachings of the present invention, the first element, component, region, layer or part discussed below may be represented as a second element, component, region, layer or part.

Terms for spatial relations such as "under", "below", "on", "above", etc., can be used here for the convenience of description to describe the relationship between one element or feature and other components or features shown in the figures. It should be understood that in addition to the orientation shown in the figures, the intent of the spatial relations term includes different orientations of devices in use and operation. For example, if the device in the drawings is turned over, then the element or feature described as "under" or "below" will be oriented to "above" the other element or feature. Therefore, the example term "below" and "under" can include these two orientations: below and above. The device may be additionally oriented (rotated 90 degrees or other orientations) and the spatial descriptions used herein are interpreted accordingly.

The terms used herein are intended only to describe specific embodiments and are not a limitation of the invention. When used herein, "a", "an" and "said/this" in the singular form are also intended to include the plural form unless the context clearly indicates otherwise. It should also be understood that the terms "comprising" and/or "including" when used in the specification, determine the presence of the feature, integer, step, operation, element and/or component, but do not exclude the presence or addition of one or more other features, integer, step, operation, element, component and/or group. When used herein, the term "and/or" includes any and all combinations of related listed items.

In order to fully understand the invention, the detailed structure and steps will be proposed in the following description, so as to explain the technical scheme of the invention. The preferred embodiments of the invention are described in detail below, however, in addition to these detailed descriptions, the invention may have other embodiments.

As mentioned above, in order to obtain a lower on-resistance based on the same voltage resistance, a super-junction (SJ) technology is required. However, when the SJ technology is used in laterally transistors (such as LDMOS), many problems may be encountered, such as reliability issues, and then process implementation issues.

The structure and existing problems of the lateral transistors (such as LDMOS) when using SJ technology will be explained below in combination with FIG. 1A to FIG. 3C, so as to better understand the present application.

Firstly, as shown in FIG. 1A, a lateral double-diffused metal-oxide semiconductor device generally includes a P-type substrate 100, an N-drift region 101 formed on the substrate 100, and a P-type well region 102 formed in the N-drift region 101, the P-type well region 102 is used as a P-type body region. A P+ active region 103 and an N+ source region 104 are formed in P-type well region 102. The P+ active region 103 is used to lead out the P-type well region 102, and the N+ source region 104 is used to lead out a source. An N+ drain region 105 is also formed in the N-drift region 101, which is spaced apart from the P-type well region, for leading out a drain electrode. A polysilicon field plate 106 is formed on the N-drift region 101 to serve as an electrode layer of the gate. The polysilicon field plate 106 and the P-type well region 102 have an overlapping region, which is a channel of the device. A source terminal field plate 107 and a drain terminal field plate 108 are also formed on the N-drift region 101. The source terminal field plate 107 is located above the P-type body region 102 and the polysilicon field plate 106, and is electrically connected to the P+ active region 103 and the N+ source region 104 via a contact 109. The drain terminal field plate 108 is located above the N+ drain region 105, and is electrically connected to the N+ drain region 105 via the contact 109. The difference between the lateral double-diffused metal-oxide semiconductor device shown in FIG. 1B and the conductor device shown in FIG. 1A is that a silicon on insulator (SOI) substrate is used, i.e. a buried oxide (BOX) is formed between the substrate 100 and the drift region 101, and the thickness of the drift region 101 is relatively small. Other structures are similar or the same, which will not describe here.

Figure 1B:
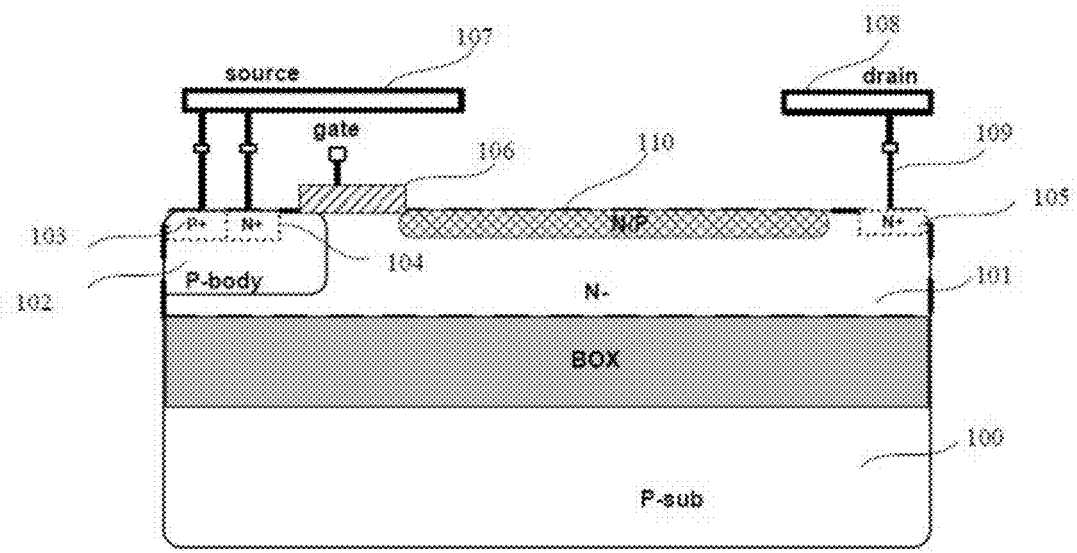
FIG. 1B is a schematic sectional view of a lateral double-diffused metal-oxide semiconductor device formed with a super-junction in the prior art.
Figure 1C:
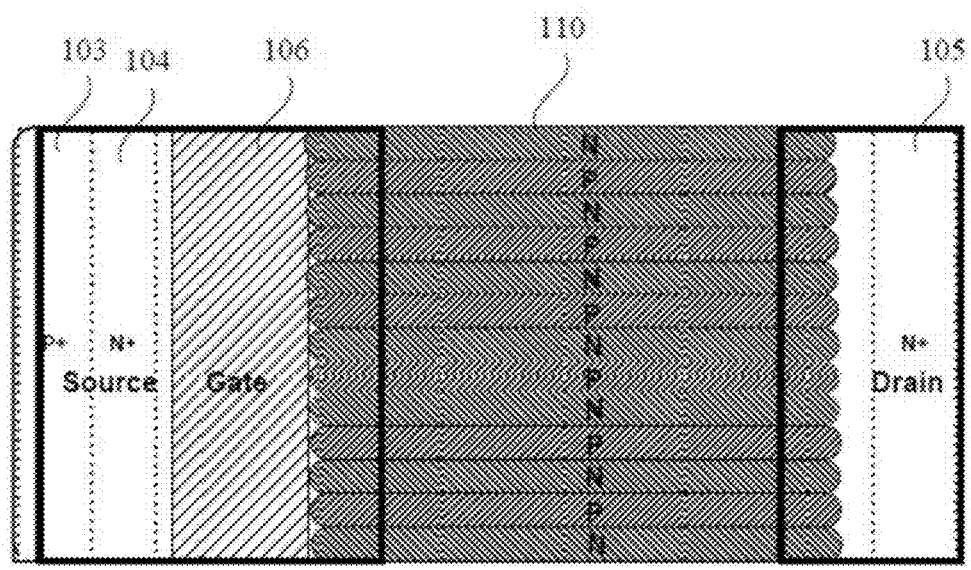
FIG. 1C is a schematic top view of the lateral double-diffused metal-oxide semiconductor device shown in FIG. 1A and FIG. 1B.
Figure 1D:
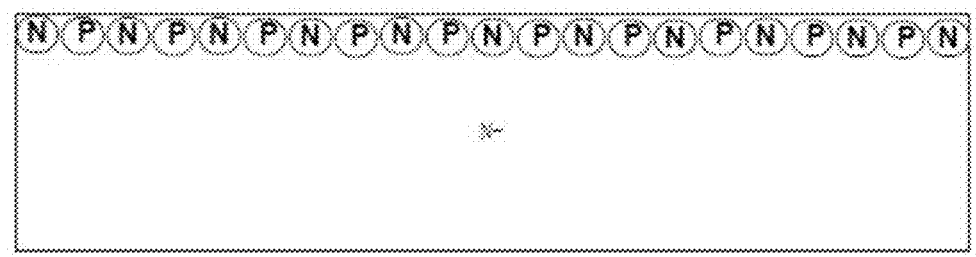
FIG. 1D is a schematic prototype of the lateral double-diffused metal oxide semiconductor device shown in FIG. 1A and FIG. 1B.

In the lateral double-diffused metal-oxide semiconductor device shown in FIG. 1A or FIG. 1B, in order to reduce the on-resistance, a super-junction 110 is formed between the channel and the N+ drain region 105 (or between the P-type well region 102 and the N+ drain region 105). As shown in FIG. 1C and FIG. 1D, a super-junction 110 includes a P-type implantation region and an N-type implantation region that are alternately arranged, and the P-type implantation region and N-type implantation region extend along the direction of source terminal and drain terminal. When the device is in the off state, the P-type and N-type implantation regions deplete each other to achieve high-voltage resistance, so that the on-resistance can be reduced by increasing the doping concentration of P-type implantation region and N-type implantation region at the same time. However, the N-type implantation region and the P-type implantation region with high concentration will inevitably introduce high electric field on the surface of the device, and it is difficult or even impossible for the device to pass the reliability test.

Figure 2A:
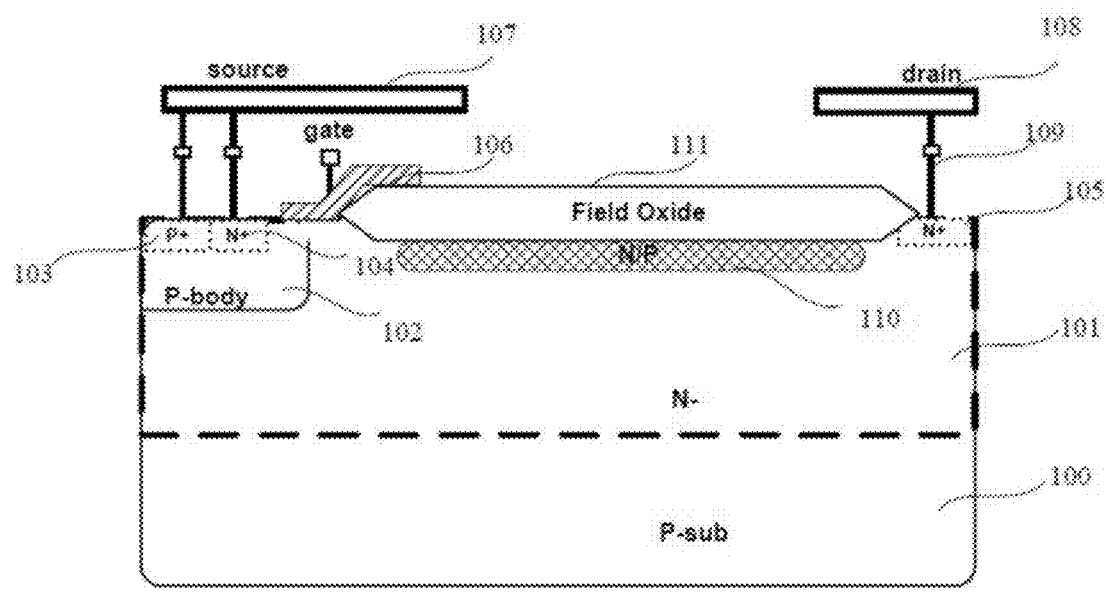
FIG. 2A to FIG. 2C are schematic sectional views of another lateral double-diffused metal-oxide semiconductor device formed with a super-junction in the prior art.
Figure 2B:
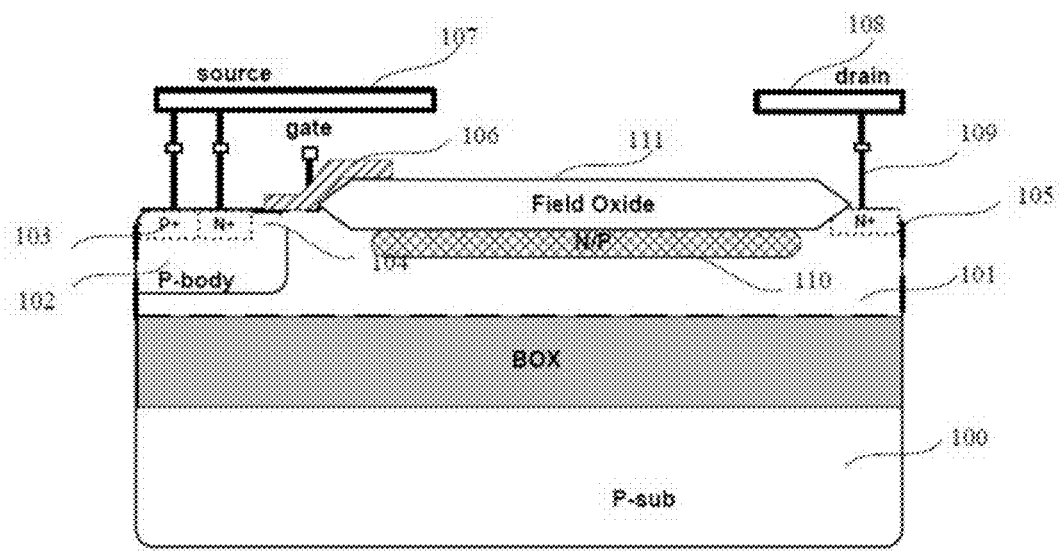
Figure 2C:
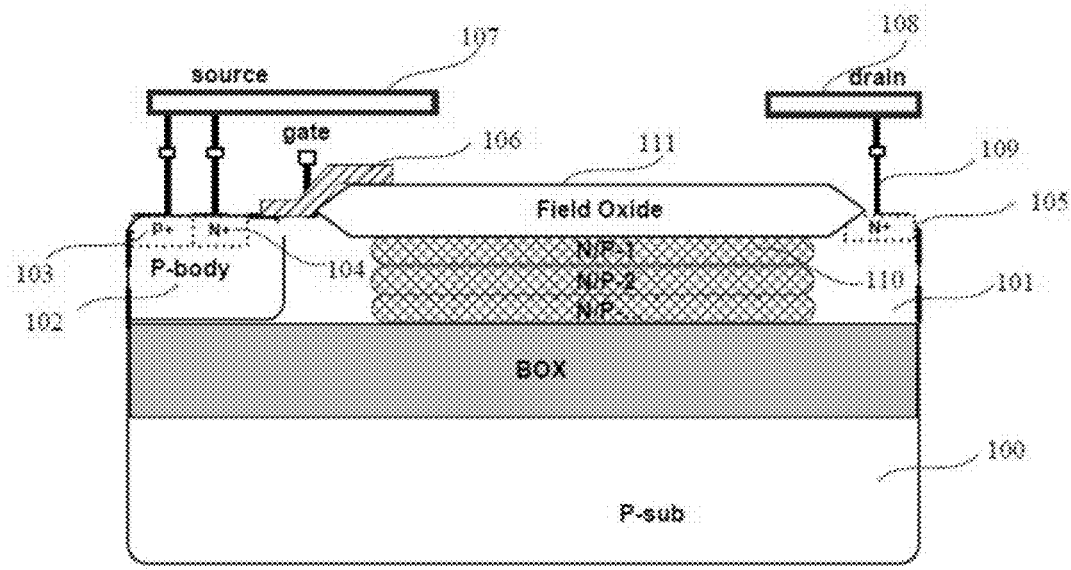

In order to address the above problems, there are generally two solutions:

In the first solution, as shown in FIG. 2A to FIG. 2C, an oxide layer isolation structure 111 (i.e. field oxide) is formed between the channel and the N+ drain region 105. The specific implementation method is that an oxide isolation structure 111 having a thickness greater than 0.5 μm is formed between the channel and the N+ drain region 105 through a high-temperature process. Then an N-type implantation region and a P-type implantation region are formed through a high-energy implantation. However, this method has the following disadvantages: 1) Since the high-temperature process cannot be performed after the formation of N-type implantation region and P-type implantation region, the N-type implantation region and P-type implantation region can only be formed after the oxide layer isolation structure 111, and twice of photolithography and implantation are required. In order to penetrate the preformed oxide layer isolation structure 111 with a thickness greater than 0.5 μm, a high-energy implantation is required, which requires a photoresist layer having a great thickness to protect the region that does not need implantation. And the width and the spacing of N-type implantation region and the P-type implantation region are crucially important for the super-junction. If the implantation region needs to be defined by twice of photolithography with thick photoresist, it is difficult to control the process to guarantee the uniformity and stability of the width and spacing of the N-type implantation regions and the P-type implantation regions, which will ultimately affect the performance of the super-junction. 2) In the SOI (silicon on insulator) structure, in order to further reduce the on-resistance, it is necessary to form multi-layers of N-type implantation region and P-type implantation region on the thin silicon layer SOI as shown in FIG. 2C, that is, multiple high-energy implantations are performed, and the cost is increased.

Figure 3A:
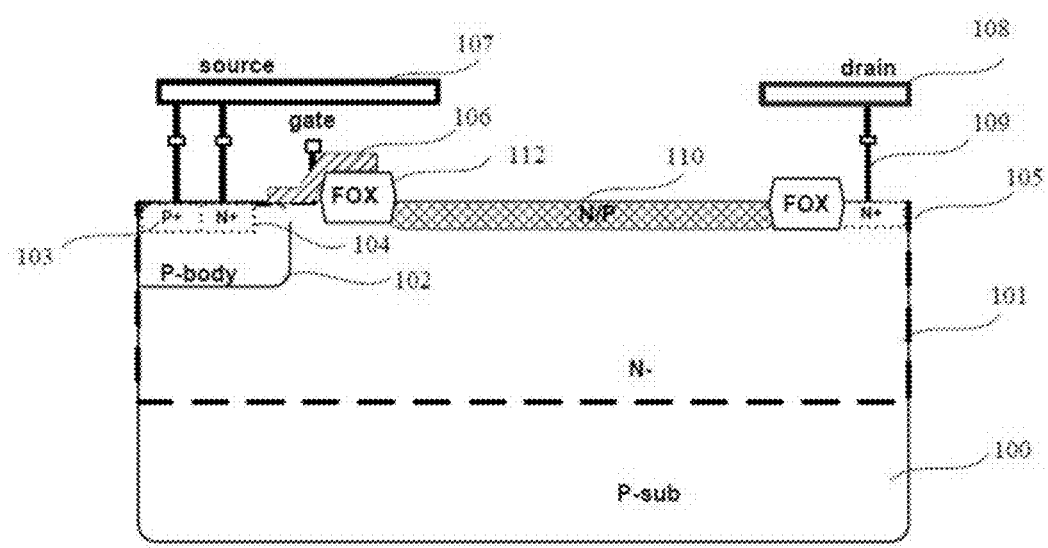
FIG. 3A to FIG. 3C are schematic sectional views of yet another lateral double-diffused metal-oxide semiconductor device formed with a super-junction in the prior art.
Figure 3B:
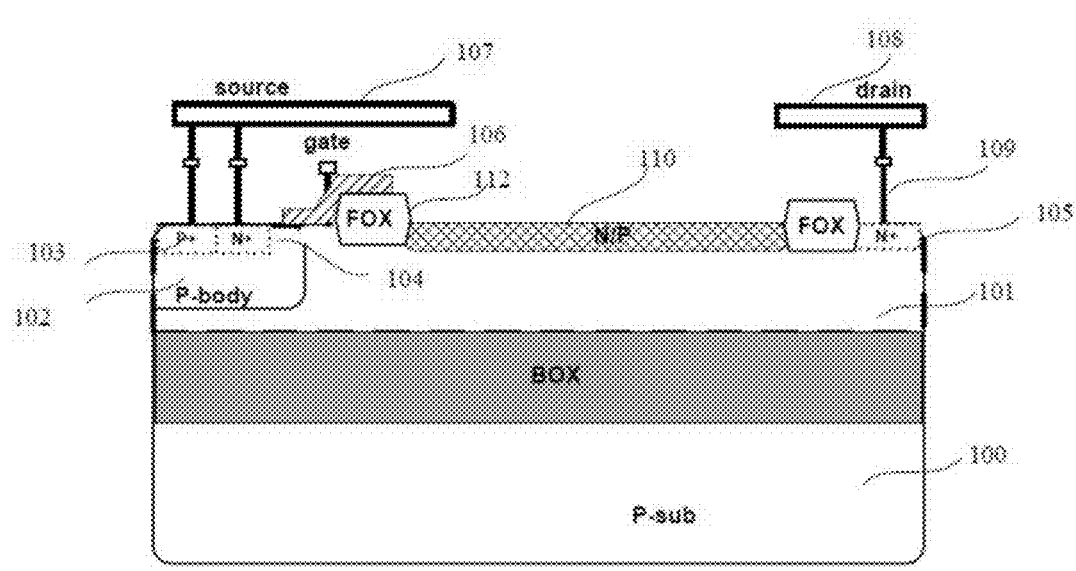
Figure 3C:
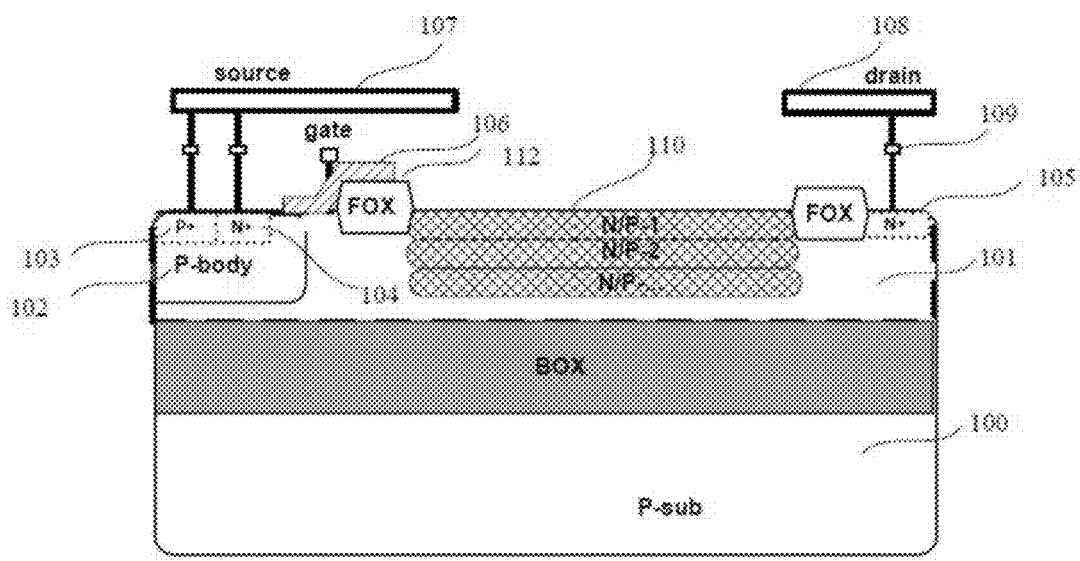

In the second solution, as shown in FIG. 3A to FIG. 3C, a local oxide layer isolation structure 112 (i.e. field oxide or FOX) having a thickness greater than 0.5 μm is formed in the corresponding region under the source field plate 107 and the drain field plate 108, and then an N-type implantation region and a P-type implantation region are formed by implantation. However, this method has the following disadvantages: 1) Since there is no need to penetrate the field oxide during the formation of the N-type implantation region and the P-type implantation region, the thick photoresist process is not required, which reduces the difficulty of the process control to a certain extent, but the N-type implantation region and P-type implantation region are still defined by twice photolithography, and the process is still difficult to control. 2) The field oxide only improves the high electric field and the charge caused under the source field plate and drain field plate, while the N-type implantation region and P-type implantation region with high concentration still have a high electric field, and there is no barrier between the implantation regions and the dielectric layer, so the reliability issue still exists. 3) As identical to the first solution, in order to further reduce the on-resistance, it is necessary to form a multi-layers of N-type implantation region and P-type implantation region on the thin silicon layer SOI as shown in FIG. 3C, that is, multiple high-energy implantations are performed, and the cost is increased.

In conclusion, although the formation of super-junction in the lateral double-diffused metal-oxide semiconductor devices can reduce the on-resistance, there are various problems in the current implementation methods, and it is difficult to obtain good results. In order to address the above problems, a structure and a method for manufacturing a lateral double-diffused metal-oxide semiconductor device are proposed in the present disclosure, which will be described in combination with FIG. 4A to FIG. 8D.

Figure 4A:
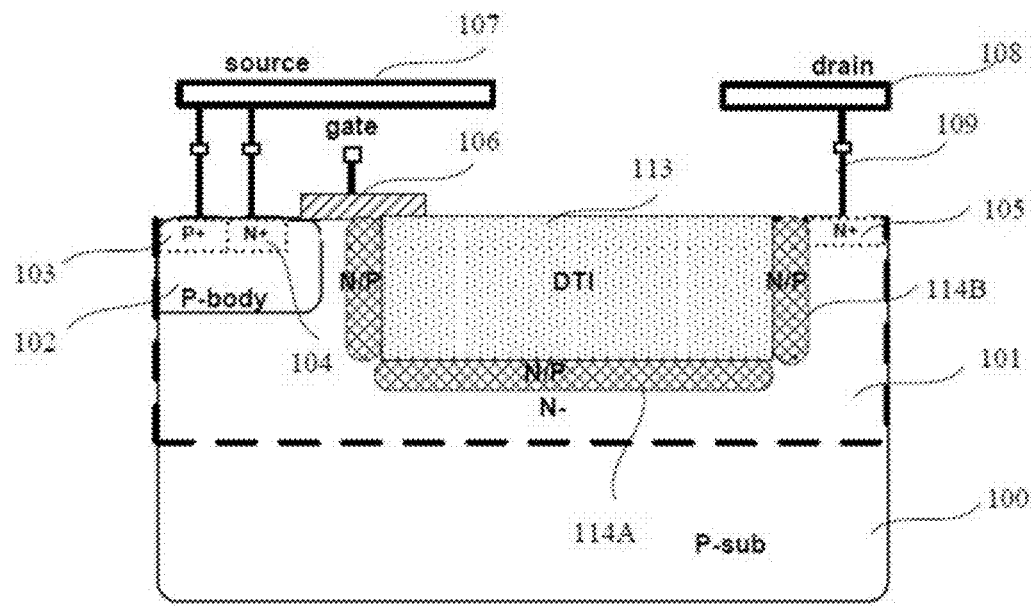
FIG. 4A is a schematic sectional view of a lateral double-diffused metal-oxide semiconductor device according to an embodiment of the present disclosure.

Firstly, as shown in FIG. 4A, a lateral double-diffused metal-oxide semiconductor device is proposed in the present disclosure, which includes a P-type substrate 100, an N-drift region 101 formed on the substrate 100, and a P-type well region 102 formed in the N-drift region 101, and the P-type well region 102 is used as a body region. A P+ active region 103 and an N+ source region 104 are formed in the P-type well region 102. The P+ active region 103 is used to lead out the P-type well region 102, and the N+ source region 104 is used to lead out a source. An N+ drain region 105 is formed in the N-drift region 101 to lead out a drain. A polysilicon field plate 106 is formed on the N-drift region 101 and serves as an electrode layer of gate. The polysilicon field plate 106 and the P-type body region 102 have an overlapping region, which is a channel of the device. A source terminal field plate 107 and a drain terminal field plate 108 are also formed on the N-drift region 101. The source terminal field plate 107 is located above the P-type well region 102 and the polysilicon field plate 106, and is electrically connected to the P+ active region 103 and the N+ source region 104 via a contact 109. The drain terminal field plate 108 is located above the N+ drain region 105 and is electrically connected to the N+ drain region 105 via the contact 109. In the semiconductor device shown in FIG. 4A, in order to use the super-junction technology to further reduce the on-resistance, a deep trench isolation structure (DTI) 113 is formed in the N-drift region 101 and between the P-type well region 102 and the N+ drain region 105. A horizontal super-junction (i.e. an N-type implantation region and a P-type implantation region that are alternatively arranged) 114A and a vertical super-junction 114B are formed at a bottom and a sidewall of the deep trench isolation structure 113, respectively. The N-type implantation region and the P-type implantation region of the horizontal super-junction 114A are similar to those shown in FIG. 1C, in other words, the N-type implantation region and the P-type implantation region extend along a direction of the source terminal and the drain terminal. The N-type implantation region and the P-type implantation region of the vertical super-junction 114B extend along a direction perpendicular to the substrate 100. By forming the super-junction at the bottom and the sidewall of the deep trench isolation structure, firstly, since there is no high concentration implantation region on the surface of the device, no high electric field will be introduced into the surface of the device, which is conducive to improve the reliability of the device. Secondly, the drift region is changed from linear to U-shaped, which greatly reduces the size of the device and the on-resistance. Thirdly, since there is no need to form a field oxide, the thick photoresist and the high-energy implantation process are not required, then the process cost is reduced, and the controllability of the width and the spacing of N-type implantation region and P-type implantation region is enhanced, the device performance is effectively improved.

Figure 4B:
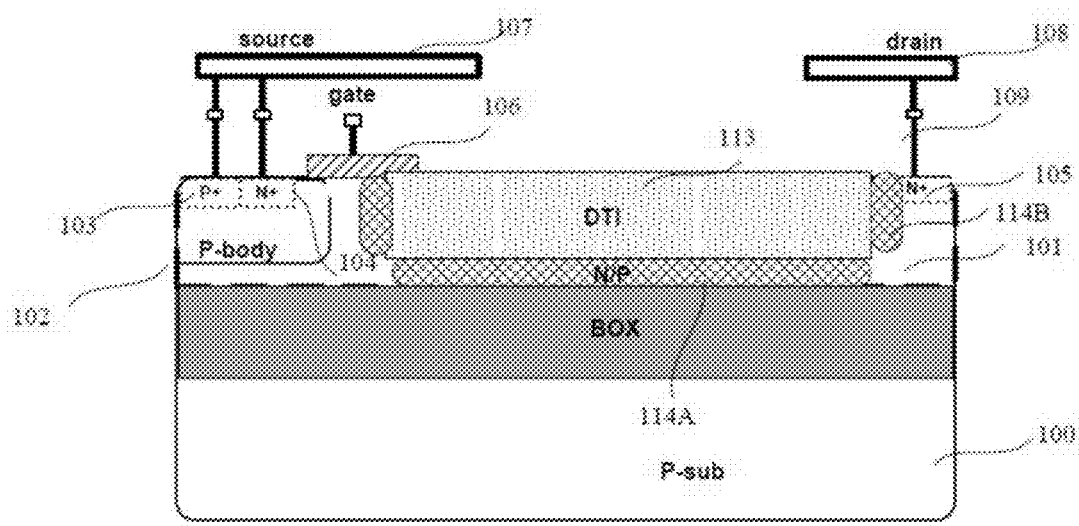
FIG. 4B is a schematic sectional view of a lateral double-diffused metal-oxide semiconductor device according to another embodiment of the present disclosure.

The difference between the lateral double-diffused metal-oxide semiconductor device shown in FIG. 4B and the lateral double-diffused metal-oxide semiconductor device shown in FIG. 4A is that, a silicon-on-insulator substrate is used, in other words, a buried oxide (BOX) layer is formed between the substrate 100 and the drift region 101. Other structures are similar or the same, which will not be described here.

Figure 4C:
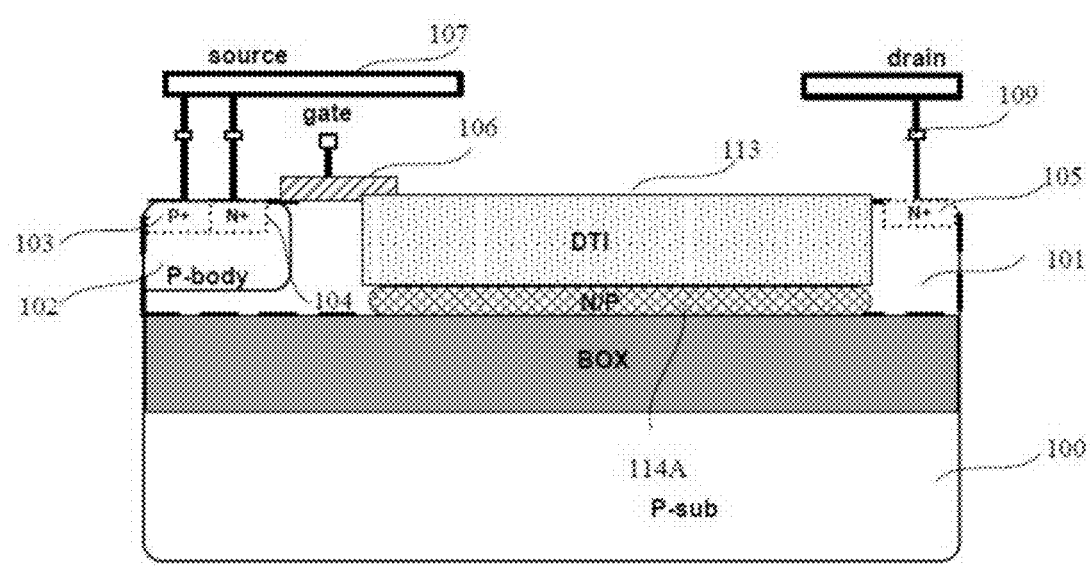
FIG. 4C is a schematic sectional view of a lateral double-diffused metal-oxide semiconductor device according to yet another embodiment of the present disclosure.
Figure 5:
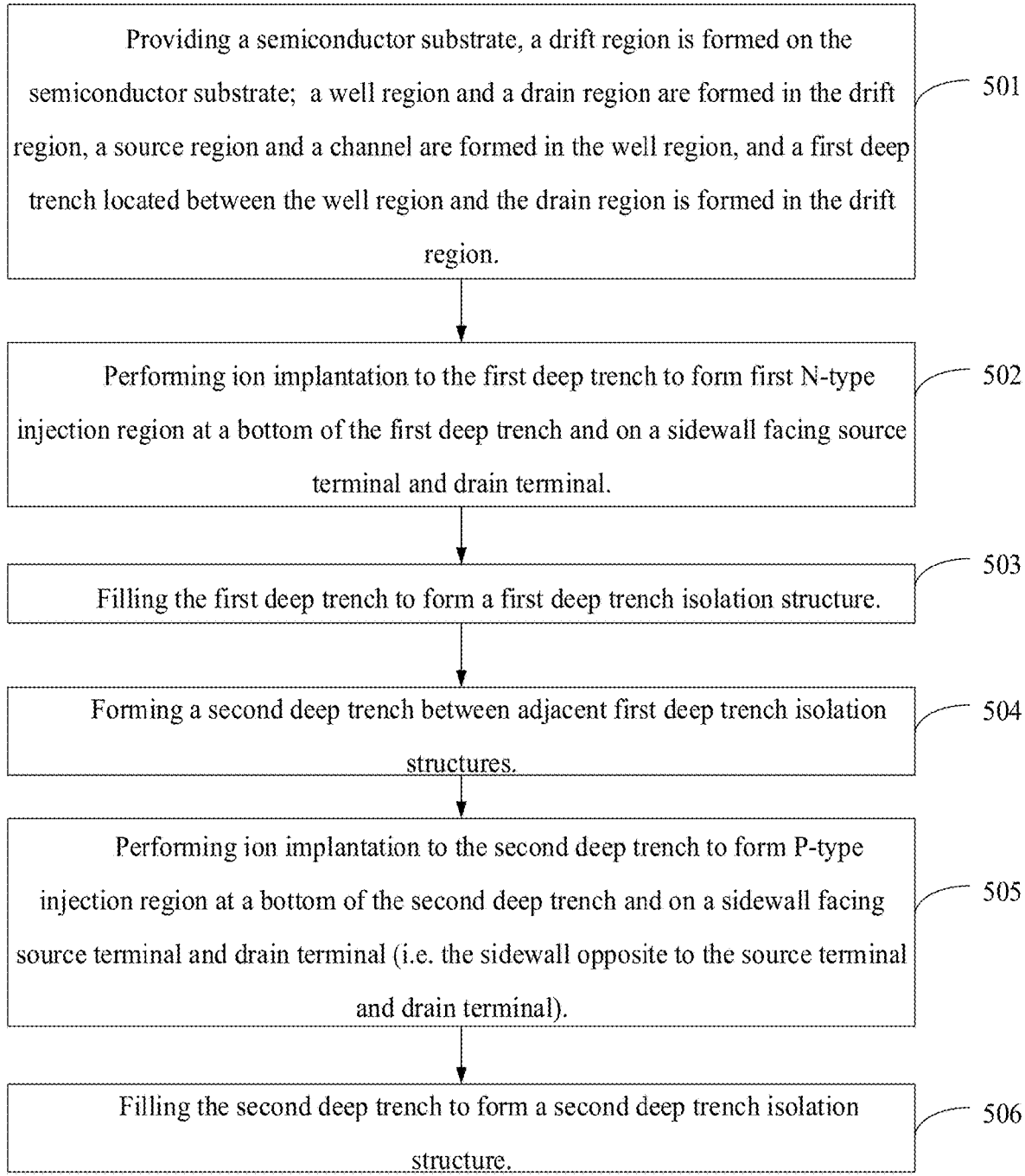
FIG. 5 is a flow chart of a manufacturing method for lateral double-diffused metal-oxide semiconductor device according to an embodiment of the present disclosure.

Further, when using a thin silicon layer silicon-on-insulator substrate (i.e., the silicon layer on the buried oxide (BOX) layer is relatively thin), it is not necessary to use a deep trench isolation structure (DTI), and the depth of an exemplary deep trench isolation structure is 0.5 µm to 2 µm. Therefore, when performing N-type/P-type implantation, as shown in FIG. 4C, a sidewall doping is not required, it only requires to form a super-junction at the bottom of the deep trench isolation structure 113. As such, when using the thin silicon layer silicon-on-insulator substrate, the difficulty of the process is much lower than that of using bulk-silicon substrate, the feasibility is high, and the reliability issue can be effectively solved.

The method for manufacturing the lateral double-diffused metal-oxide semiconductor device proposed by this disclosure is described below in combination with FIG. 5 to FIG. 8D.

It should be noted that, for the lateral double-diffused metal-oxide semiconductor device proposed in the disclosure, the drift region, the P-type well region, the N+ drain region, etc. can be formed using the conventional method for manufacturing the lateral double-diffused metal-oxide semiconductor device, which will not be described in greater details. The formation process of the super-junction of the lateral double-diffused metal-oxide semiconductor device proposed in the disclosure will be mainly described as following.

As shown in FIG. 5 and FIG. 6A to FIG. 6D, the method for manufacturing the lateral double-diffused metal-oxide semiconductor device shown in FIG. 4A and FIG. 4B includes:

At step 501, a semiconductor substrate is provided. A drift region is formed on the semiconductor substrate. A well region and a drain region are formed in the drift region. An active region and a channel are formed in the well region. First deep trenches 601 are formed in the drift region and between the well region and the drain region (i.e., between the source region and the drain region), and the formed structure is shown as in FIG. 6A.

The first deep trenches 601 can be formed by a photolithography and an etching process commonly used in the art, which will not be described here. The first deep trenches 601 extend along a direction from the source terminal to the drain terminal, and the first deep trenches 601 are arranged in parallel and spaced apart.

Figure 6A:
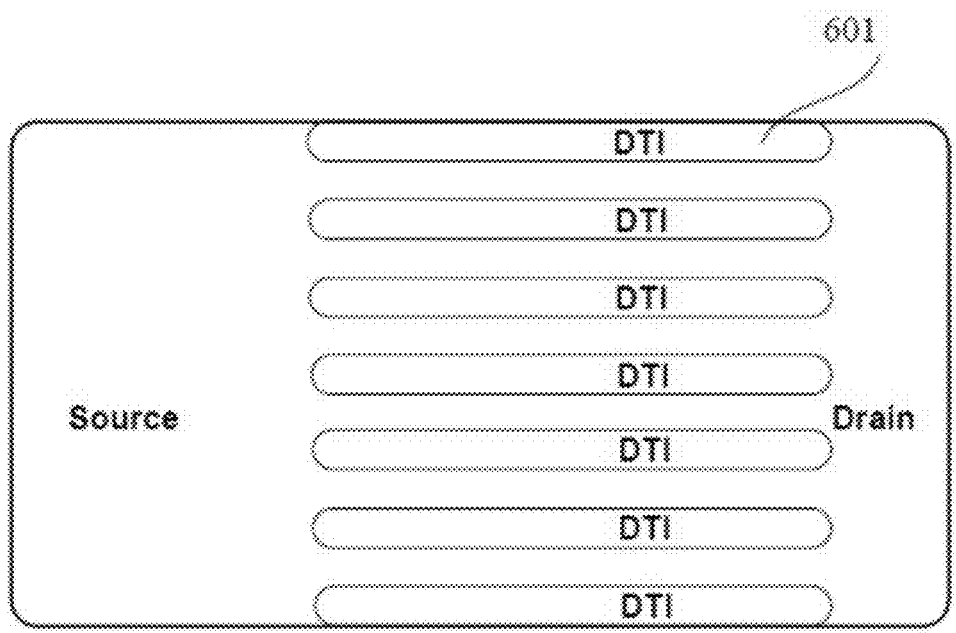
FIG. 6A to FIG. 6D are the sectional views of the device obtained by sequentially implementing the process of the manufacturing method for lateral double-diffused metal-oxide semiconductor device according to the embodiment of the present disclosure.
Figure 6B:
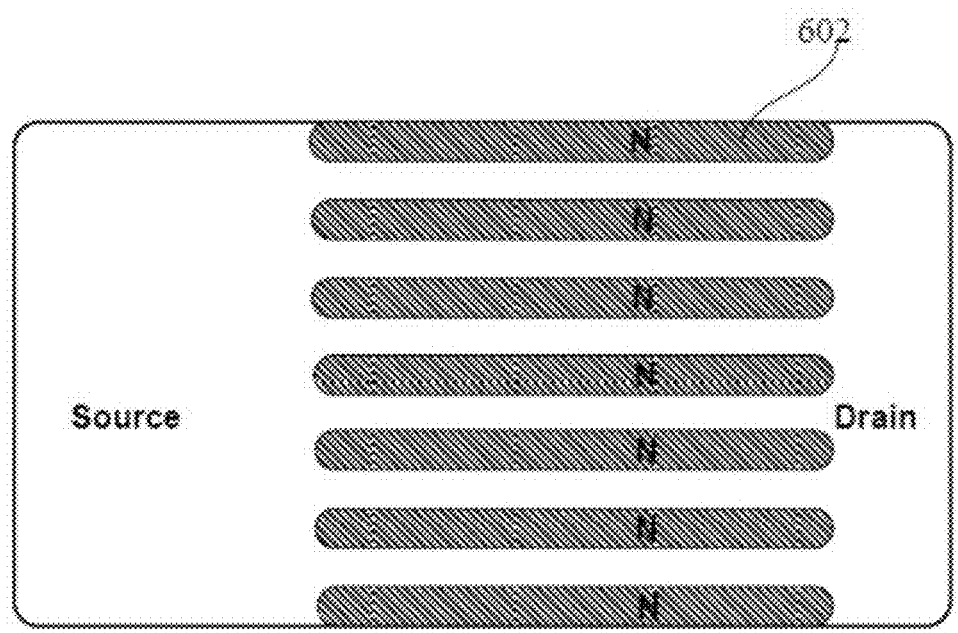

At step 502, an ion implantation is performed to the first deep trenches 601 to form N-type implantation regions 602 at the bottom of the first deep trench 601 and the sidewall of the first deep trench 601 facing the source terminal and the drain terminal (i.e., the sidewall opposite to the source terminal and the drain terminal), and the formed structure is shown as in FIG. 6B.

For example, the N-type implantation region 602 includes a first N-type implantation region formed at the bottom of the first deep trench 601 and a second N-type implantation region formed on the sidewall of the first deep trench 601.

The formation of the N-type implantation region 602 is performed by the ion implantation method commonly used in the art, which will not be described here.

At step 503, the first deep trenches 601 are filled to form a first deep trench isolation structure.

For example, the first deep trenches 601 are filled (i.e., an oxide is formed in the first deep trench 601) by methods such as CVD (chemical vapor deposition), ALD (atomic layer deposition) to form a first deep trench isolation structure.

Figure 6C:
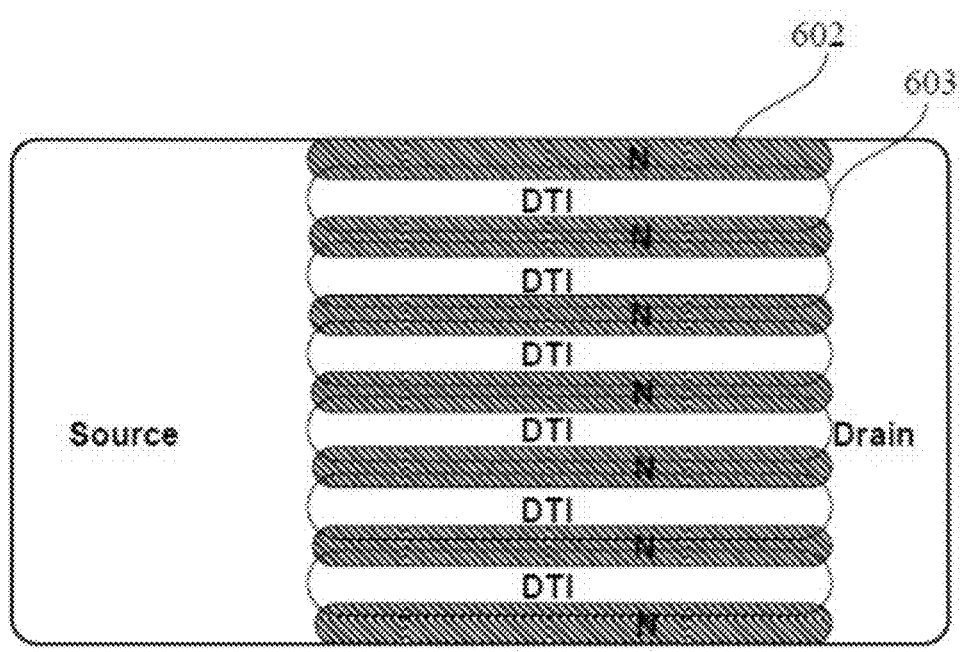

At step 504, second deep trenches 603 are formed between the adjacent first deep trench isolation structures, and the formed structure is shown as in FIG. 6C.

The second deep trenches 603 can be formed by the photolithography and etching process commonly used in the art, which will not be described here. The second deep trenches 603 extend along a direction from the source terminal to the drain terminal, and the second deep trenches 603 are arranged in parallel and spaced apart.

Furthermore, the pattern of the second deep trenches 603 (or the pattern of photoresist) and the pattern of the first deep trenches 601 are overlapped to a certain extent, such that the drift region between adjacent first deep trench isolation structures can be completely removed by a highly selective etching process. It can not only makes it possible that no drift region is formed between the subsequent formed N-type implantation region and the P-type implantation region, but also the width and spacing of the N-type and P-type implantation regions can be controlled by controlling the widths of the first deep trenches and second deep trenches.

Figure 6D:
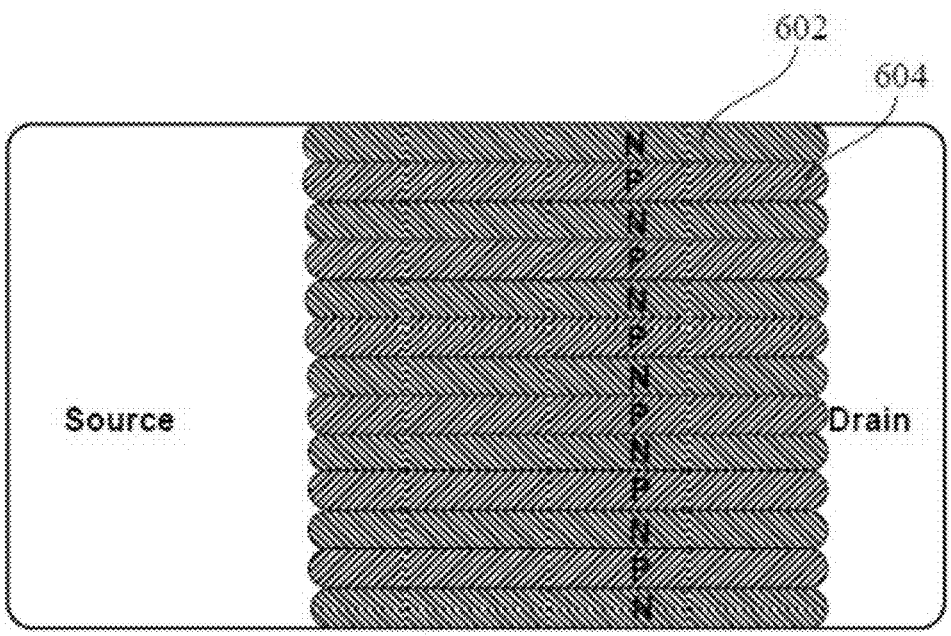

At step 505, an ion implantation is performed to the second deep trenches 603 to form P-type implantation regions 604 at the bottom and the sidewall of the second deep trencher 603, and the formed structure is shown as in FIG. 6D.

For example, the P-type implantation region 604 includes a first P-type implantation region at the bottom of the second deep trench 603 and a second P-type implantation region on the sidewall of the second deep trench 603.

The formation of P-type implantation region 604 is performed by the ion implantation method commonly used in the art, which will not be described here.

At step 506, the second deep trenches 603 are filled to form a second deep trench isolation structure.

For example, the second deep trenches 603 are filled (i.e. the oxide is formed in the second deep trench 603) by methods such as CVD (chemical vapor deposition), ALD (atomic layer deposition) to form the second deep trench isolation structure.

Further, in addition to the structures shown in FIG. 4A to FIG. 4C, other similar structures can be adopted based on similar principles. For example, in order to facilitate the realization of voltage resistant of the device, only one type of doping is formed on the sidewall in the structures shown in FIG. 4A and FIG. 4B. For example, only the P-type implantation region is formed on the sidewall adjacent to the source terminal of the deep trench isolation structure, and only the N-type implantation region is formed on the sidewall adjacent to the drain terminal of the deep trench isolation structure. The method for manufacturing this structure in combination with FIG. 7 and FIG. 8A to FIG. 8D will be described in the following.

As shown in FIG. 7 and FIG. 8A to FIG. 8D, the manufacturing method includes:

At step 701, a semiconductor substrate is provided. A drift region is formed on the semiconductor substrate. A well region and a drain region are formed in the drift region. An active region and a channel are formed in the well region. A first deep trench 801A and a third deep trench 801B are formed in the drift region and between the well region and the drain region (i.e. between the source region and the drain region), and the formed structure is shown as in FIG. 8A.

The first deep trench 801A can be formed by the photolithography and etching process commonly used in the art, which will not be described here. The first deep trenches 801A extend along a direction from the source terminal to the drain terminal, and the first deep trenches 801A are arranged in parallel and spaced apart. The third deep trench 801B extends in a direction perpendicular to the direction from the source terminal to the drain terminal (i.e., perpendicular to the first deep trench 801A), and the third deep trench 801B is located on a side adjacent to the drain terminal.

Figure 8A:
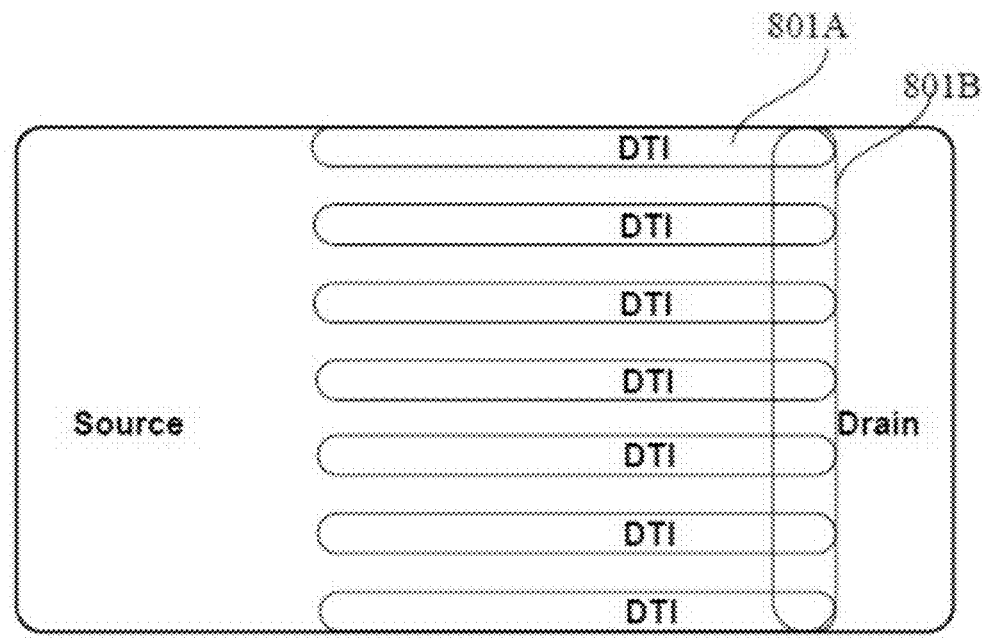
FIG. 8A to FIG. 8D are the sectional views of the device obtained by sequentially implementing the process of the manufacturing method for lateral double-diffused metal-oxide semiconductor device according to yet another embodiment of the present disclosure.
Figure 8B:
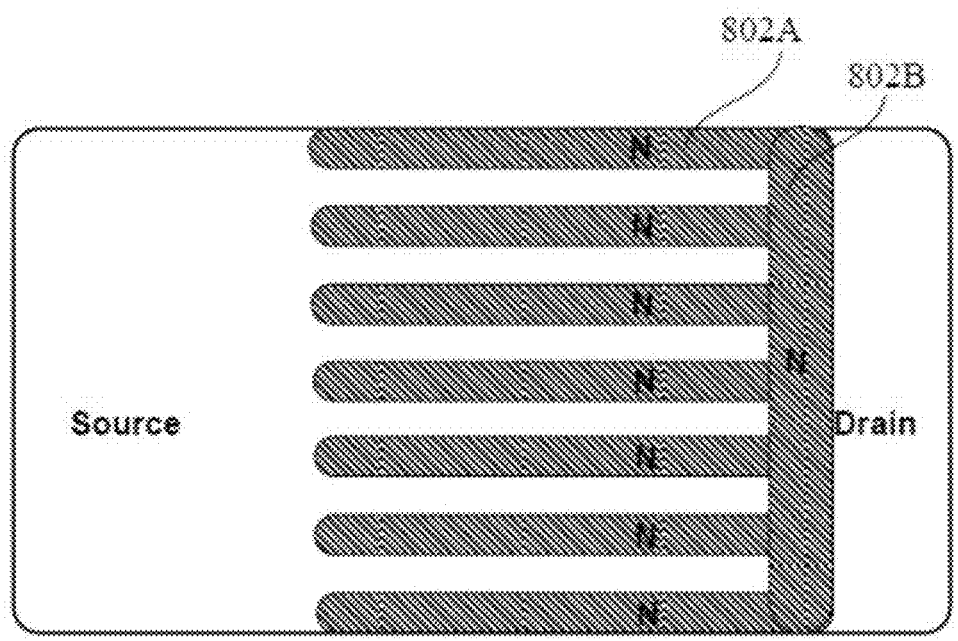

At step 702, the ion implantation is performed to the first deep trenches 801A and the third deep trenches 801B to form a first N-type implantation region 802A at the bottom of the first deep trench 801A and a third N-type implantation region 802B at the bottom and the sidewall of the third deep trench 801B, and the formed structure is shown as in FIG. 8B.

The first N-type implantation region 802A is located at the bottom of the first deep trench 801A and extends along a direction from the source terminal to the drain terminal.

The third N-type implantation region 802B is located on the side adjacent to the drain terminal. By forming the third N-type implantation region 802B, the N-type ion doping concentration on the side adjacent to the drain terminal (N+) is higher than the N-type ion doping concentration on the side adjacent to the source terminal.

At step 703, the first deep trench 801A and the third deep trench 801B are filled to form a first deep trench isolation structure.

For example, the first deep trench 801A and the third deep trench 801B are filled (i.e., the oxides are formed in the first deep trench 801A and the third deep trench 801B) by methods such as CVD (chemical vapor deposition), ALD (atomic layer deposition) to form the first deep trench isolation structure.

Figure 8C:
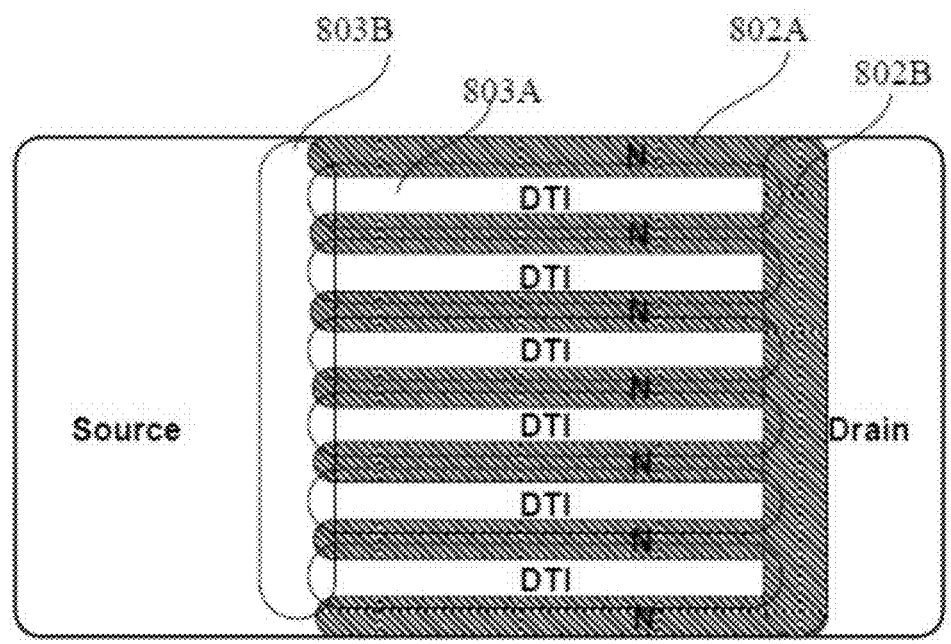

At step 704, a second deep trench 803A and a fourth deep trench 803B are formed, and the formed structure is shown as in FIG. 8C.

The second deep trench 803A and the fourth deep trench 803B can be formed by photolithography and etching process commonly used in the art, which will not be discussed here. The second deep trenches 803A extend along a direction from the source terminal to the drain terminal, and the second deep trenches 803A are arranged in parallel and spaced apart.

The fourth deep trench 803B extends in a direction perpendicular to the direction from the source terminal to the drain terminal (that is, perpendicular to the second deep trench 803A), and the fourth deep trench 803B is located on the side adjacent to the source terminal.

Furthermore, the pattern of the second deep trench 803A (or the pattern of photoresist) and the pattern of the first deep trench 801A are overlapped to a certain extent, such that the area of drift region between the adjacent first deep trench isolation structures can be completely removed by a highly selective etching process. It can not only makes it possible that no drift region is formed between the subsequent formed N-type implantation region and the P-type implantation region, but also the width and spacing of the N-type implantation region and the P-type implantation region are controlled by controlling the width of the first deep trench and the second deep trench.

Figure 8D:
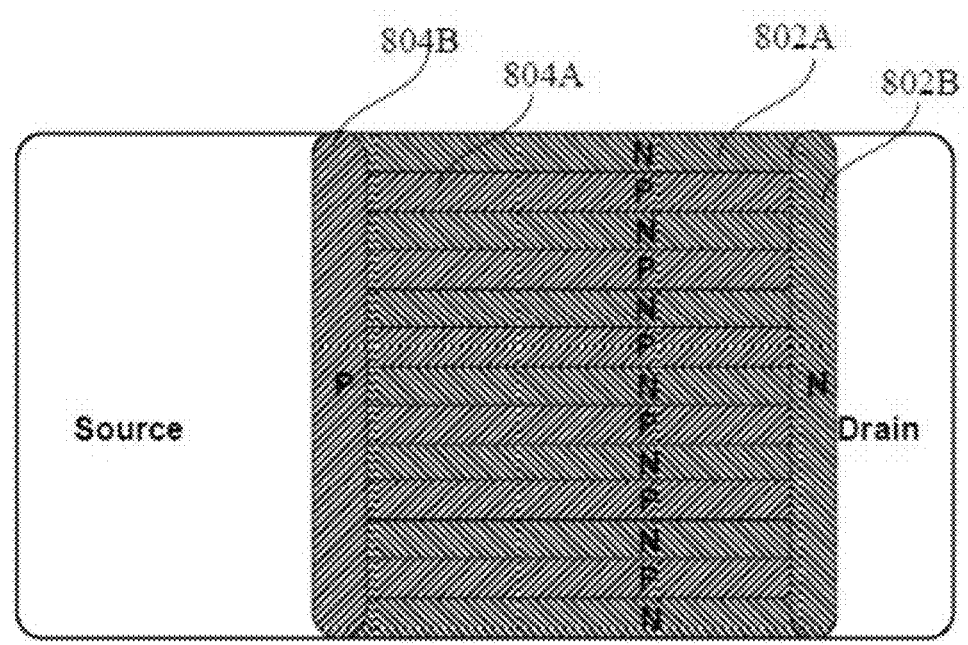

At step 705, the ion implantation is performed to the second deep trench 803A and the fourth deep trench 803B to form a first P-type implantation region 804A at the bottom of the second deep trench 803A and a third P-type implantation region 804B at the bottom and the sidewall of the fourth deep trench 803B, and the formed structure is shown as in FIG. 8D.

For example, the first P-type implantation region 804A extends along a direction from the source terminal to the drain terminal.

The third P-type implantation region 804B is located on the side adjacent to the source terminal. By forming the third P-type implantation region 804B, the P-type ion doping concentration on the side adjacent to the source terminal (P+) is higher than the P-type ion doping concentration on the side adjacent to the drain terminal.

At step 706, the second deep trench 803A and the fourth deep trench 803B are filled to form a second deep trench isolation structure.

For example, the second deep trench 803A and the fourth deep trench 803B are filled (i.e. the oxides are formed in the second deep trench 803A and the fourth deep trench 803B) by methods such as CVD (chemical vapor deposition) and ALD (atomic layer deposition) to form the second deep trench isolation structure.

As mentioned above, since the N-type ion doping concentration on the side adjacent to the drain terminal (N+) is higher than the N-type ion doping concentration on the side adjacent to the source terminal (P+), and the P-type ion doping concentration on the side adjacent to the source terminal (P+) is higher than the P-type ion doping concentration on the side adjacent to the drain terminal, the formed super-junction will be depleted and pinched-off in a middle region between the source and drain. Therefore the impact on the source and drain is reduced, and the reliability of the device is further improved.

Further, in this embodiment, in order to make the depletion region of the super-junction to be pinched-off in the middle region between the source terminal and the drain terminal as far as possible, it can also be realized by gradually reducing the width of the first deep trench 801A from the drain terminal to the source terminal, and gradually reducing the width of the second deep trench 803A from the source terminal to the drain terminal, which allow the width of the first N-type implantation region 802A to be gradually reduced from the drain terminal to the source terminal, and the width of the first P-type implantation region 804A to be gradually reduced from the source terminal to the drain terminal. The N-type ion doping concentration on the side adjacent to the drain terminal is higher than the N-type ion doping concentration on the side adjacent to the source terminal, and the P-type ion doping concentration on one side adjacent to the source terminal (P+) is higher than the P-type ion doping concentration on the side adjacent to the drain terminal, therefore the depletion area of the super-junction is pinched-off between the source terminal and the drain terminal as far as possible. It should be noted that the width of the first N-type implantation region 802A herein refers to a size of the first N-type implantation region 802A in the direction perpendicular to its extension along the source terminal to the drain terminal, and the width of the first P-type implantation region 804A refers to a size of the first P-type implantation region 804A in the direction perpendicular to its extension along the source terminal to the drain terminal.

The invention has been described by the above embodiments, but it should be understood that the above embodiments are only for the purpose of illustration and explanation, rather than to limit the invention to the scope of the described embodiments. In addition, it is understood by those skilled in the art that the invention is not limited to the above embodiments, and more varieties and modifications can be made according to the teaching of the invention, these varieties and modifications fall within the scope of the protection required by the invention. The scope of protection of the invention is defined by the appended claims and their equivalent scope.

What is claimed is:

1. A lateral double-diffused metal-oxide semiconductor device, comprising:
    a semiconductor substrate;
    a drift region disposed on the semiconductor substrate, wherein the drift region comprises a well region and a drain region, and the well region comprises a source region and a channel; and
    a deep trench isolation structure disposed between the well region and the drain region of the drift region, wherein a first P-type implantation region and a first N-type implantation region are alternately arranged at a bottom of the deep trench isolation structure to form a super-junction, the first P-type implantation region and the first N-type implantation region extend along a direction from the well region to the drain region.

2. The lateral double-diffused metal-oxide semiconductor device according to claim 1, wherein a second P-type implantation region and a second N-type implantation region are alternately arranged on a sidewall of the deep trench isolation structure.

3. The lateral double-diffused metal-oxide semiconductor device according to claim 2, wherein the second P-type implantation region and the second N-type implantation region extend in a direction perpendicular to the semiconductor substrate.

4. The lateral double-diffused metal-oxide semiconductor device according to claim 1, wherein the first P-type implantation region and the first N-type implantation region are arranged in parallel.

5. The lateral double-diffused metal-oxide semiconductor device according to claim 1, wherein a third implantation region having the same conductivity type as the well region is provided on a side of the deep trench isolation structure adjacent to the well region;
    a fourth implantation region having the same conductivity type as the drain region is provided on a side of the deep trench isolation structure adjacent to the drain region.

6. The lateral double-diffused metal-oxide semiconductor device according to claim 5, wherein the third implantation region is P-type implantation region, and the fourth implantation region is N-type implantation region.

7. The lateral double-diffused metal-oxide semiconductor device according to claim 1, wherein a width of the first P-type implantation region decreases gradually from a side thereof with the same conductivity type as the first P-type implantation region to a side thereof with the opposite conductivity type to the first P-type implantation region;
    the width of the first N-type implantation region decreases gradually from a side thereof with the same conductivity type as the first N-type implantation region to a side thereof with the opposite conductivity type to the first N-type implantation region.

8. The lateral double-diffused metal-oxide semiconductor device according to claim 1, wherein the semiconductor substrate is a silicon substrate or a silicon-on-insulator substrate.

9. A method for manufacturing a lateral double-diffused metal-oxide semiconductor device, comprising:
    providing a semiconductor substrate;
    forming a drift region on the semiconductor substrate;
    forming a well region and a drain region in the drift region, forming a source region and a channel in the well region; and
    forming a deep trench isolation structure located between the well region and the drain region in the drift region, and forming a first P-type implantation region and a first N-type implantation region that are alternately arranged at a bottom of the deep trench isolation structure to form a super-junction, wherein the first P-type implantation region and the first N-type implantation region extend in a direction from the well region to the drain region.

10. The method according to claim 9, wherein the first P-type implantation region and the first N-type implantation region are formed by the following steps:
    forming first deep trenches that are spaced apart and arranged in parallel between the well region and the drain region in the drift region;
    performing ion implantation to the first deep trench to form one of the first P-type implantation region and the first N-type implantation region at the bottom of the first deep trench;
    filling the first deep trenches to form first deep trench isolation structures;
    forming a second deep trench between adjacent first deep trench isolation structures;
    performing ion implantation to the second deep trench to form the other one of the first P-type implantation region and the first N-type implantation region at the bottom of the second deep trench;
    filling the second deep trenches to form second deep trench isolation structures.

11. The method according to claim 10, wherein the step of performing ion implantation to the first deep trench further comprises:
    forming one of the second P-type implantation region and the second N-type implantation region on a sidewall of the first deep trench facing the well region and the drain region;
    wherein the step of performing ion implantation to the second deep trench further comprises:
    forming the other one of the second P-type implantation region and the second N-type implantation region on a sidewall of the second deep trench facing the well region and the drain region.

12. The method according to claim 10, wherein the step of performing ion implantation to the first deep trench comprises:
    performing ion implantation to the first deep trench to form one of the first P-type implantation region and the first N-type implantation region at the bottom of the first deep trench and on the sidewall facing the well region and the drain region;
    the step of performing ion implantation to the second deep trench comprises:
    performing ion implantation to the second deep trench to form the other one of the first P-type implantation region and the first N-type implantation region at the bottom of the second deep trench and on the sidewall facing the well region and the drain region.

13. The method according to claim 10, wherein after the step of forming first deep trenches that are spaced apart and arranged in parallel between the well region and the drain region in the drift region, the method further comprises:
   forming a third deep trench on a side of the first deep trench opposite to the drain region,
   wherein after the step of performing ion implantation to the first deep trench, the method further comprises:
   forming a fourth implantation region having the same conductivity type as the drain region at a bottom and a sidewall of the third deep trench;
   wherein after the step of forming the second deep trench between adjacent first deep trench isolation structures, the method further comprises:
   forming a fourth deep trench on a side of the second deep trench opposite to the well region;
   wherein after the step of performing ion implantation to the second deep trench, the method further comprises:
   forming a third implantation region having the same conductivity type as the well region at a bottom and a sidewall of the fourth deep trench.

14. The method according to claim 13, wherein the third implantation region is P-type implantation region and the fourth implantation region is N-type implantation region.

15. The method according to claim 9, wherein a width of the first P-type implantation region decreases gradually from a side thereof with the same conductivity type as the first P-type implantation region to a side thereof with the opposite conductivity type to the first P-type implantation region;
   the width of the first N-type implantation region decreases gradually from a side thereof with the same conductivity type as the first N-type implantation region to a side thereof with the opposite conductivity type to the first N-type implantation region.

* * * * *